United States Patent
Arimoto

Patent Number: 5,394,146
Date of Patent: Feb. 28, 1995

[54] DIGITAL TO ANALOG CONVERTER

[75] Inventor: Masao Arimoto, Itami, Japan

[73] Assignee: Mitsubishi Denki Kabushiki Kaisha, Tokyo, Japan

[21] Appl. No.: 69,109

[22] Filed: May 28, 1993

[30] Foreign Application Priority Data

Jun. 23, 1992 [JP] Japan .................. 4-164828

[51] Int. Cl.6 .................................. H03M 1/06
[52] U.S. Cl. ............................. 341/118; 341/144
[58] Field of Search ................. 341/118, 144, 138

[56] References Cited

U.S. PATENT DOCUMENTS

| | | | |
|---|---|---|---|
| 4,168,528 | 9/1979 | Comer | 364/606 |
| 4,430,642 | 2/1984 | Weigand et al. | 341/141 |
| 4,591,832 | 5/1986 | Fling et al. | 341/141 |
| 4,677,581 | 6/1987 | Malka et al. | 364/571 |
| 4,972,188 | 11/1990 | Clement et al. | 341/118 |

FOREIGN PATENT DOCUMENTS 3617433 12/1986 Germany .

OTHER PUBLICATIONS

Elektronik, Aug. 17/19, 1988, Dipl. -Ing. K. D. Kroczek, "Multiplizierender 12-Bit-Dac Fur Zahlreiche Anwendungen", pp. 90-93.

Primary Examiner—Marc S. Hoff
Attorney, Agent, or Firm—Oblon, Spivak, McClelland, Maier, & Neustadt

[57] ABSTRACT

A D-A converter in which a phase deviation in load current is inhibited and a digital to analog conversion accuracy is enhanced. A data dividing block (7) is provided to switch a path depending upon a value of the most significant bit of an N bit digital signal (DATA) so as to conduct the D-A converting and the V-I converting based upon an (N-1)bit digital signal (DATA(N-1)) in either one of a first analog current output path consisting of a D-A converting block (11) and a V-I converting unit (210) and a second analog current output path consisting of a D-A converting block (12) and a V-I converting unit (220). Thus, since a large range of load current can be obtained and a phase deviation in the load current can be inhibited, a D-A conversion accuracy is enhanced.

7 Claims, 8 Drawing Sheets ns
DIGITAL TO ANALOG CONVERTER

BACKGROUND OF THE INVENTION

1. Field of the Invention

The present invention relates to a digital to analog (D-A) converter for converting a digital signal to an analog signal and utilizing the analog signal to drive a load.

2. Description of the Prior Art

FIG. 7 is a circuit diagram showing a driving circuit for a load where a prior art D-A converter is used. As shown in FIG. 7, an N-bit digital signal DATA is taken in a D-A converting block 1. The D-A converting block 1 converts the digital signal DATA to analog voltage $V_{IN}$.

The analog voltage $V_{IN}$ is applied to a negative input of an operational amplifier 2 via a node 4 and a resistance 101. The negative input of the operational amplifier 2 is connected to a load 3 via resistances 104 and 105 while a positive input of the operational amplifier 2 is grounded via a resistance 102 and also connected to the load 3 via a resistance 103. The resistances 101 through 104 all have a common resistance value r, and the resistance 105 has a resistance value $R_0$.

In such a structure, applying the N-bit digital signal DATA to the D-A converting block 1, the D-A converting block 1 converts the digital signal DATA to the analog voltage $V_{IN}$ to output it to the node 4.

At this time, assuming that an amplification factor of the operational amplifier 2 is $A_V$, output voltage $V_{01}$ of the operational amplifier 2 can be obtained according to the following Formula 1:

$$V_{01} = A_V \left( \frac{V_0}{2} \right) - \left( \frac{V_{01} + V_{IN}}{2} \right) \tag{1}$$

Formula 1 is transformed to obtain Formula 2:

$$V_{01} = \frac{1}{1 + \frac{2}{A_V}} (V_0 - V_{IN}) \tag{2}$$

Then, a formula expressing a relation between voltages $V_0$ and $V_{01}$ at opposite ends of the resistance 105 will be set up. Assuming now that an impedance of the load 3 is Z, Formula 3 is obtained as follows:

$$V_{01} = \left( \frac{R_0}{2r \| Z} + 1 \right) V_0 \tag{3}$$

Then, substituting Formula 3 into Formula 2, $V_0$ is expressed as in Formula 4:

$$V_0 = -\frac{1 + \frac{2}{A_V}}{\left( \frac{R_0}{2r \| Z} + 1 \right) - \frac{1}{1 + \frac{2}{A_V}}} \cdot V_{IN} \tag{4}$$

Rearranging Formula 4, Formula 5 is obtained:

$$V_0 = \frac{-1}{K_1} V_{IN} \tag{5}$$

$$K_1 = \left\{ \left( 1 + \frac{R_0}{2r} \right)\left( 1 + \frac{2}{A_V} \right) - 1 \right\} + \frac{R_0}{Z}\left( 1 + \frac{2}{A_V} \right)$$

On the other hand, load current $I_0$ flowing in the load 3 is expressed as in Formula 6:

$$I_0 = \frac{V_0}{Z} \tag{6}$$

Substituting Formula 5 into Formula 6, the load current $I_0$ is expressed as in Formula 7:

$$I_0 = \frac{-1}{K_2} V_{IN} \tag{7}$$

$$K_2 = Z\left\{ \left( 1 + \frac{R_0}{2r} \right)\left( 1 + \frac{2}{A_V} \right) - 1 \right\} + R_0\left( 1 + \frac{2}{A_V} \right)$$

Assuming now that $r \gg R_0$ and $A_V \gg Z$ are satisfied, Formula 7 is simplified into Formula 8:

$$I_0 = \frac{-V_{IN}}{R_0} \tag{8}$$

Thus, regardless of the impedance Z of the load 3, the load current $I_0$ can be determined.

In this way, the D-A converting block 1 converts the digital signal DATA to the analog voltage $V_{IN}$, which, in turn, the operational amplifier 2 converts into the load current $I_0$ regardless of the impedance Z of the load 3 to supply it to the load 3. That is, the digital signal DATA is utilized to drive the load 3.

However, when a frequency of the D-A converted analog voltage is close to a GB (gain-bandwidth) product of the operational amplifier, the amplification factor $A_V$ of the operational amplifier takes a value close to 1. Hence, $A_V \gg Z$ is not satisfied, which results in Formula 8 not being exact, and therefore, the load current $I_0$ is affected by the impedance Z of the load 3.

The prior art D-A converter is structured as mentioned above, and as shown in FIG. 8, it is provided with a single D-A converting block 1 for converting the N-bit digital data DATA. This is why N bits are needed for the D-A converting bit of the D-A converting block 1.

FIG. 9 is a graph revealing problems of the prior art D-A converter shown in FIGS. 7 and 8. In FIG. 9, although an ideal load current $I_0$ is expressed by Curve L1, a V-I converting characteristic of a voltage to current converter (V-I converter) 20 causes an actual curve related to a reference current $I_{00}$ to deviate to a plus side (Curve L2) or deviate to a minus side (Curve L3). In such a case, a leading phase shift results ($t_{01}$-$t_{00}$) when the actual curve deviates to the plus side, or otherwise a lagging phase shift results ($t_{00}$-$t_{02}$) when it deviates to the minus side. That is, in the prior art D-A converter, because of the V-I converting characteristic of the V-I converter, there arises a phase difference in its load current.

SUMMARY OF THE INVENTION

According to the present invention, a D-A converter comprises digital data dividing means having first and second outputs and receiving an N bit digital signal for outputting, from a first one of the first and second outputs, partial digital data which is (N-1) bit digital data obtained by eliminating the most significant bit from the digital signal, and outputting, from a second one of the first and second outputs, fixed digital data; first D-A converting means connected to the first output of the digital data dividing means for D-A converting the digital data received from the first output to output first analog voltage; second D-A converting means connected to the second output of the digital data dividing means for D-A converting the digital data received from the second output to output second analog voltage; first voltage to current converting means receiving the first analog voltage for voltage to current converting the first analog voltage to output fist analog current; second voltage to current converting means receiving the second analog voltage for voltage to current converting the second analog voltage to output second analog current; and current synthesizing means for synthesizing the first analog current and the second analog current to output synthetic analog current.

Preferably, the first voltage to current converting means includes a first operational amplifier for receiving the first analog voltage on its positive input, a first resistance having its first terminal connected to a negative input of the first operational amplifier and its second terminal connected to first supply voltage, and a first transistor having its first electrode connected to the first terminal of the first resistance and its control electrode connected to output of the first operational amplifier; the second voltage to current converting means includes a second operational amplifier for receiving the second analog voltage on its positive input, a second resistance having its first terminal connected to a negative input of the second operational amplifier and its second terminal connected to second supply voltage, and a second transistor having its first electrode connected to the first terminal of the second resistance and its control electrode connected to output of the second operational amplifier; and the current synthesizing means is wiring for connecting the second electrode of the first transistor and the second electrode of the second transistor.

Preferably, the D-A converter further comprises a first buffer having its input connected to the first terminal of the first resistance and its output input connected to the first terminal of the first resistance and its output connected to the negative input of the first operational amplifier, and a second buffer having its input connected to the first terminal of the second resistance and its output connected to the negative input of the second operational amplifier.

Preferably, the first supply voltage defines High level while the second supply voltage defines Low level; the first transistor is a P channel transistor while the second transistor is an N channel transistor.

Preferably, the digital data dividing means outputs the partial digital data to the first D-A converting means and first fixed digital data to the second D-A converting means when the most significant bit of the digital data is 1; or it outputs the partial digital data to the second D-A converting means and second fixed digital data to the first D-A converting means when the most significant bit of the digital data is 0.

Preferably, first analog voltage which the first D-A converting means develops by D-A converting the second fixed digital data is of a value sufficient to always keep the second transistor in its ON-state; and second analog voltage which the second D-A converting means develops by D-A converting the first fixed digital data is of a value sufficient to always keep the first transistor in its ON-state.

Preferably, the synthetic current is a current for driving a load having a specified impedance.

Preferably, the D-A converter further comprises a first low pass filter interposed between output of the first D-A converting means and input of the first voltage to current converting means, and a second low pass filter interposed between output of the second D-A converting means and input of the second voltage to current converting means.

According to the present invention, a D-A converter as defined in one embodiment is provided with a first analog current output path consisting of first D-A converting means and first voltage to current converting means, and a second analog current output path consisting of second D-A converting means and second voltage to current converting means.

Then, digital data dividing means outputs partial digital data to one of those analog current output paths depending upon 0 or 1 of the most significant bit of an N bit digital signal, and therefore, D-A converting bit required in the first and second D-A converters may be only a half of the bit required in a structure having only one D-A converter.

Synthetic current is obtained by synthesizing first and second analog currents output from the first and second analog current output paths, respectively, and therefore, its range is greater compared with a structure having only one analog current output path.

In addition to that, selective switching between the first and second analog current output paths is carried out depending upon 0 or 1 of the most significant bit of the digital signal, and therefore, a phase deviation caused in synthetic current is corrected at a time of the 0/1 switching of the most significant bit.

On the other hand, since a D-A converter as defined in a further embodiment is provided with first and second low pass filters between outputs of first and second D-A converting means and inputs of first and second voltage to current converting means, respectively, digital components of waveforms of first and second analog voltages are eliminated, and the remaining portions are applied to the first and second voltage to current converting means, respectively.

Accordingly, it is an object of the present invention to provide a D-A converter in which a phase deviation of load current is inhibited and a D-A conversion accuracy is enhanced.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
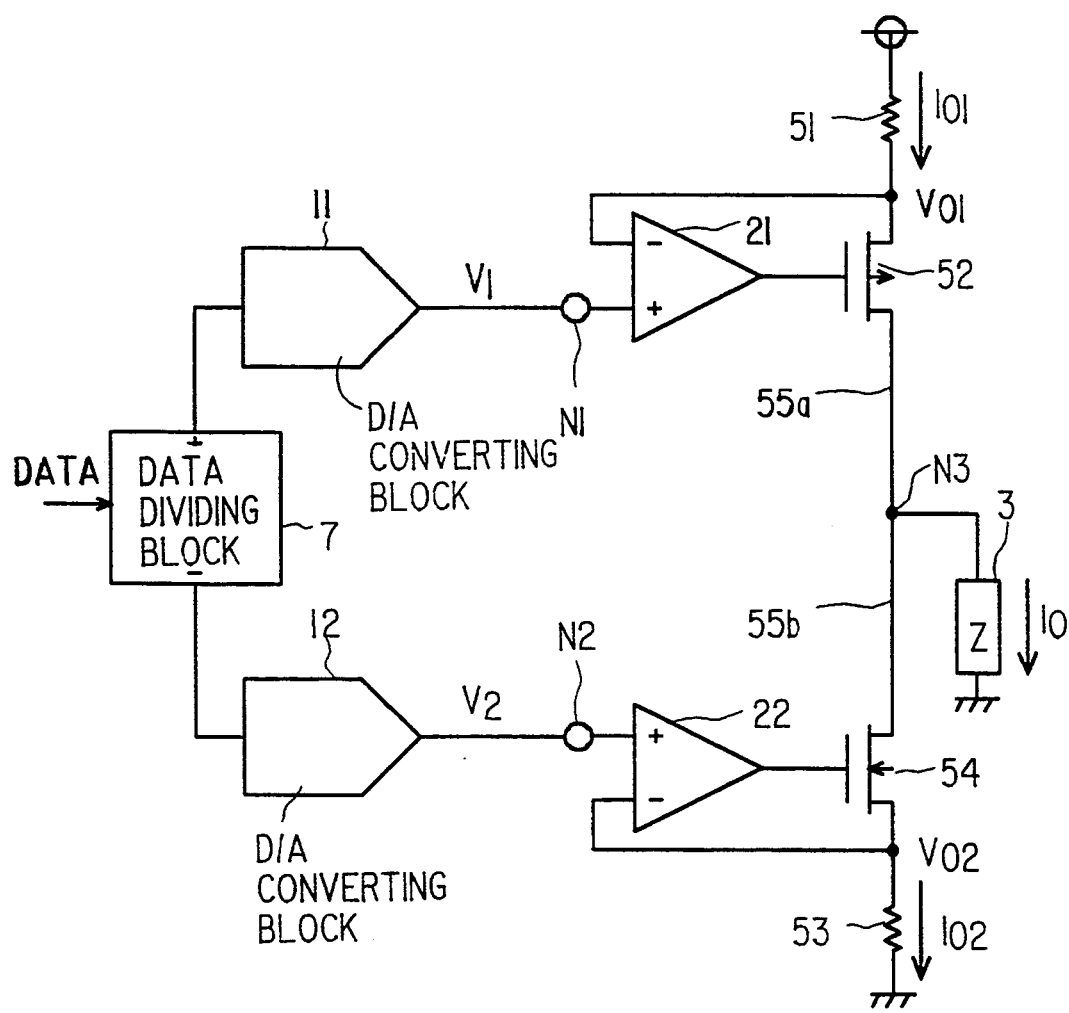
FIG. 1 is a circuit diagram showing a structure of a D-A converter of a first preferred embodiment according to the present invention.

FIG. 1 is a circuit diagram showing a structure of a D-A converter of a first preferred embodiment according to the present invention. As shown in FIG. 1, N bit digital data DATA is taken in a data dividing block 7. The data dividing block 7 outputs (N-1) bit digital data DATA(N-1) to one of D-A converting blocks 11 and 12 and also outputs fixed digital data to the other of them depending upon a logic 1 or 0 of the most significant bit of the digital data DATA. Specifically, when the most significant bit of the digital signal DATA is 1, the data dividing block 7 outputs the (N-1) bit digital data DATA(N-1) to the D-A converting block 11 and also outputs fixed digital data F1 to the D-A converting block 12. Otherwise, when the most significant bit of the digital signal DATA is zero, the data dividing block 7 outputs the digital data DATA(N-1) to the D-A converting block 12 and outputs fixed digital data F2 to the D-A converting block 11.

The D-A converting block 11 converts digital data output from the data dividing block 7 into analog voltage $V_1$ to apply it to an node N1. The node N1 is connected to a positive input of an operational amplifier 21. The operational amplifier 21 has its negative input connected via a resistance 51 to supply voltage $V_{CC}$ and also connected via a P channel transistor 52 and a wiring 55a to a node N3. Then, the node N3 is connected to a load 3 having an impedance Z.

On the other hand, the D-A converting block 12 converts an output from the data dividing block 7 into analog voltage $V_2$ to apply it to a node N2. The operational amplifier 22 has its negative input grounded via a resistance 53 and also connected to the node N3 via an N channel transistor 54 and a wiring 55b.

In such a structure, as expressed by Formula 9, the analog voltage $V_1$ output from the D-A converting block 11 is in proportion to the supply voltage $V_{CC}$. $V_A$ is a constant.

$$V_1 = V_{CC} - V_A \qquad (9)$$

Assuming that output voltage from the operational amplifier 21 is $V_0$, source voltage of the transistor 52 is $V_{01}$, and a voltage amplification factor of the operational amplifier 21 is $A_V$, the output voltage $V_0$ of the operational amplifier 21 is expressed as in Formula 10:

$$V_0 = A_V(V_1 - V_{01}) \qquad (10)$$

Also, current $I_{01}$ flowing in the resistance 51 is expressed as in Formula 11:

$$I_{01} = \frac{V_{cc} - V_{01}}{R_o} \qquad (11)$$

Assuming that source-gate voltage of the transistor 52 is $V_{SG}$, the current $I_{01}$ is expressed as in Formula 12:

$$I_{01} = \frac{\beta}{2}(V_{SG} - V_T)^2 \qquad (12)$$

In the above formula, $\beta$ is an amplification factor inherent in the transistor, and $V_T$ is a threshold voltage inherent in a transistor. The source-gate voltage $V_{SG}$ can be expressed as in Formula 13:

Substituting Formulas 10, 11 and 13 into Formula 12 by rearranging the $$V_{SG} = (V_{CC} - V_{01}) - (V_{CC} - V_0) \qquad (13)$$

resultant formula, Formula 14 is obtained:

$$\frac{V_{CC} - V_{01}}{R_0} = \frac{\beta}{2}\{A_V(V_{CC} - V_1) - (1 + A_V)(V_{CC} - V_{01}) - V_T\}^2 \qquad (14)$$

Expanding Formula 14 to transform it into an equation for $(V_{CC} - V_{01})$ results in Formula 15:

$$\beta R_0(1+A_V)^2(V_{CC}-V_{01})^2 - 2[1+\beta R_0(1+A_V)\{A_V(V_{CC}-V_1)-V_T\}](V_{CC}-V_{01}) + \beta R_0\{A_V(V_{CC}-V_1)\}^2 = 0 \qquad (15)$$

Thus, solving the equation for $(V_{CC} - V_{01})$ results in Formula 16:

$$V_{CC} - V_{01} = \frac{K3}{\beta R_0 \left(\frac{1}{A_V} + 1\right)^2} \qquad (16)$$

$$K3 = \frac{1}{A_V^2} + \beta R_0\left(\frac{1}{A_V} + 1\right)\left((V_{CC} - V_1) - \frac{1}{A_V}V_T\right) \pm \frac{1}{A_V}\sqrt{f(V_{CC} - V_1)}$$

In the above formula, f(x) is a linear function for x, which is represented as in the following Formula 17:

$$f(x) = 2\beta R_0\left(\frac{1}{A_V} + 1\right)x + \frac{1}{A_V}\left(\frac{1}{A_V} - 2\beta R_0 V_T\left(\frac{1}{A_V} + 1\right)\right) \qquad (17)$$

In Formula 17, $(V_{CC} - V_{01})$ is expressed with $A_V \to \infty$ as in the following Formula 18:

$$V_{CC} - V_{01} = V_{CC} - V_1 \quad (18)$$

Consequently, Formula 19 is set up as follows:

$$V_{01} = V_1 (= V_{CC} - V_A) \quad (19)$$

Thus, ($V_{CC} - V_{01}$) does not exist in the impedance Z of the load 3. The current $I_{02}$ flowing in the resistance 51 is expressed as in the following Formula 20 and does not exist in the impedance Z of the load 3:

$$I_{01} = \frac{V_{CC} - V_{01}}{R_0} = \frac{V_A}{R_0} \quad (20)$$

Similarly, consideration to source voltage $V_{02}$ of a transistor 54 results in Formula 21:

$$V_{02} = \frac{K4}{\beta_2 R_0 \left( \frac{1}{A_{V2}} + 1 \right)^2} \quad (21)$$

$$K4 = \frac{1}{A_{V2}^2} + \beta_2 R_0 \left( \frac{1}{A_{V2}} + 1 \right) \left( V_2 - \frac{1}{A_{V2}} V_{T2} \right) \pm \frac{1}{A_{V2}} \sqrt{g(V2)}$$

In the above formula, $\beta_2$ is an amplification factor inherent in a transistor, $V_{T2}$ is a threshold voltage inherent to the transistor, $A_{V2}$ is a voltage amplification factor of the operational amplifier 22. Moreover, g(y) is a linear function for y, which is expressed as in the following Formula 22:

$$g(y) = 2\beta_2 R_0 \left( \frac{1}{A_{V2}} + 1 \right) y + \frac{1}{A_{V2}} \left\{ \frac{1}{A_{V2}} - 2\beta_2 R_0 V_{T2} \left( \frac{1}{A_{V2}} + 1 \right) \right\} \quad (22)$$

In Formula 22, $V_2$ can be expressed with $A_{V2} \rightarrow \infty$ as in the following Formula 23:

$$V_2 = V_B \quad (23)$$

Assuming that source voltage of the N channel transistor 54 is $V_{02}$, the voltage $V_{02}$ is expressed as in the following Formula 24:

$$V_{02} = V_2 = V_B \quad (24)$$

Thus, sink current $I_{02}$ flowing in a resistance 53 is expressed as in the following Formula 25:

$$I_{02} = \frac{V_{02}}{R_0} = \frac{V_B}{R_0} \quad (25)$$

As a result, assuming now that the source current $I_{01}$ is positive and the sink current $I_{02}$ is negative, each of which is obtained according to Formulas 20 and 25, Formula 26 is set up and Formula 27 is also obtained with load current $I_0$ supplied to the load 3:

$$I_0 = I_{01} - I_{02} \quad (26)$$

$$I_0 = \frac{V_A - V_B}{R_0} \quad (27)$$

As will be recognized in Formula 27, the load current $I_0$ does not exist in the load impedance Z of the load 3.

Figure 2:
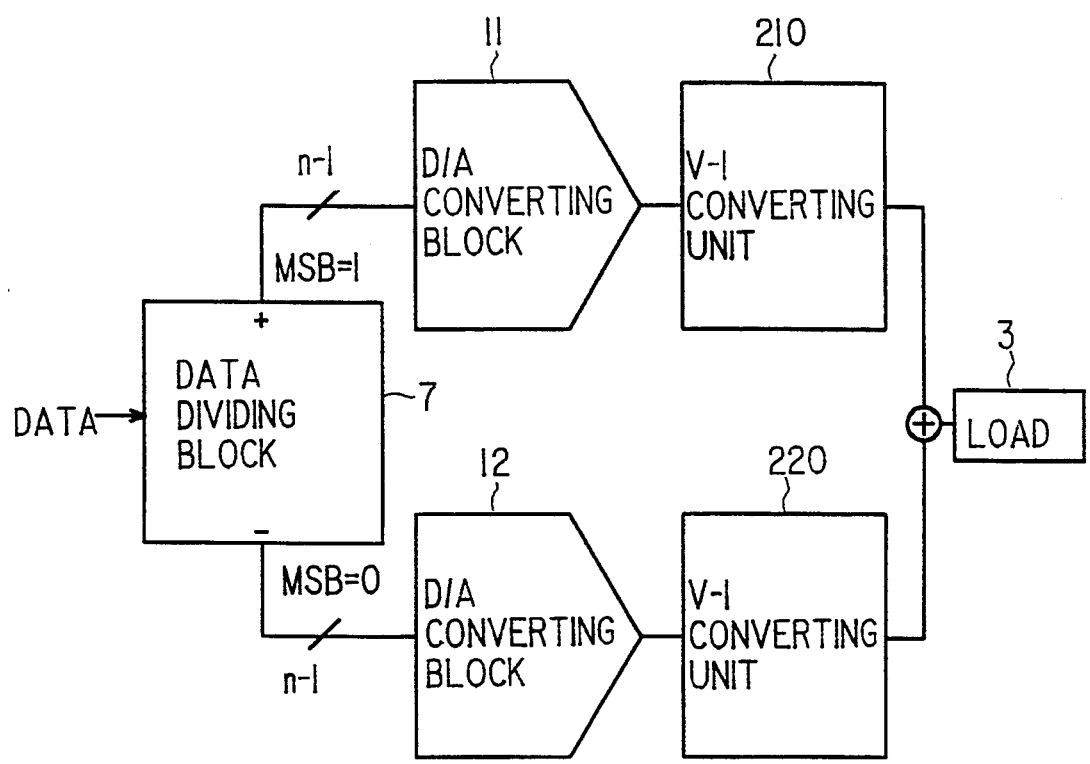
FIG. 2 is a block diagram showing a structure of the D-A converter of the first preferred embodiment according to the present invention.

A simplified structure of the first preferred embodiment is shown in FIG. 2. FIG. 2 shows a V-I converting unit 210 consisting of the operational amplifier 21, the resistance 51 and the transistor 52, and a V-I converting unit 220 consisting of the operational amplifier 22, the resistance 53 and the transistor 54.

As can be seen, the data dividing block 7 switches its path depending upon the value of the most significant bit of the N bit digital signal DATA, and it conducts the D-A converting and the V-I converting on the (N-1) bit data DATA (N-1) through a first analog current output path consisting of the D-A converting block 11 and the V-I converting unit 210 in case of the most significant bit=1 while it conducts the D-A converting and the V-I converting on the (N-1) bit data DATA (N-1) through a second analog current output path consisting of the D-A converting block 12 and the V-I converting unit 220 in case of the most significant bit=0.

Figure 8:
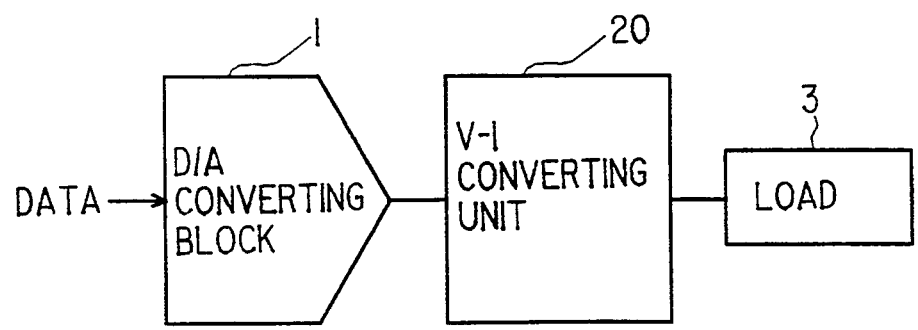
FIG. 8 is a block diagram showing a structure of the prior art D-A converter.
Figure 9:
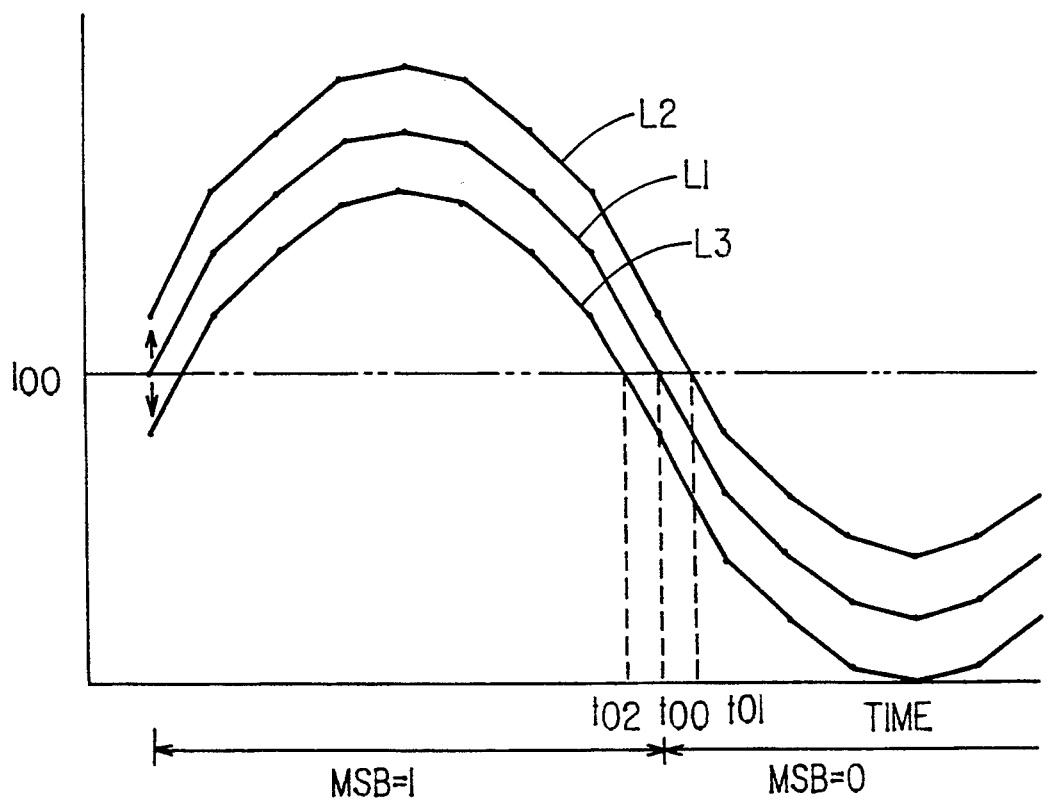
FIG. 9 is a waveform diagram revealing problems of a phase deviation in the prior art D-A converter.

Thus, the analog converting range of either of the D-A converting blocks 11 and 12 requires a range corresponding to (N-1) bits, which only a half of the required analog range of the N bit prior art D-A converting block shown in FIG. 8. In other words, even though performance (analog range) of each of the D-A converting blocks 11 and 12 is at the same level as the prior art D-A converting block, they can perform the D-A converting at double accuracy compared with the prior art.

The load current $I_0$ driving the load 3 is made by synthesizing the current $I_{01}$ and $I_{02}$ which are V-I converted by the V-I converting units 210 and 220, respectively, and therefore, a range of the load current $I_0$ can become larger than that in the structure having only one V-I converting unit.

The above mentioned two effects can be attained with a structure other than that which consists of the V-I converting units 210 and 220 as shown in FIG. 1.

Figure 3:
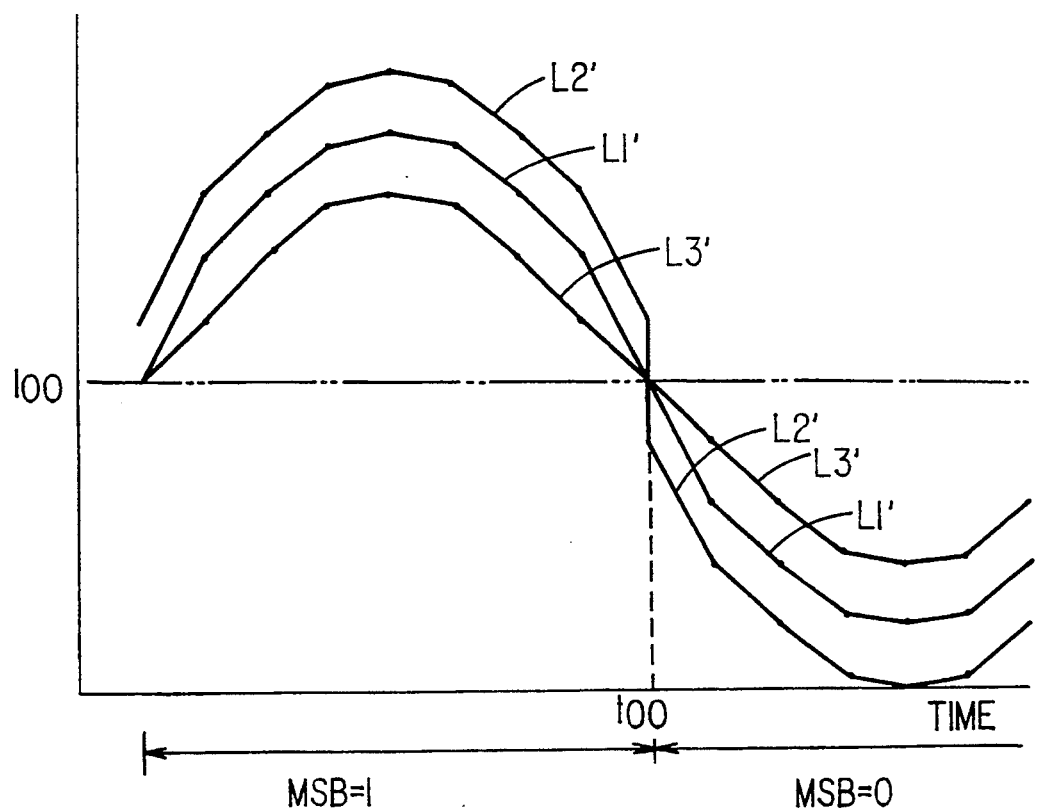
FIG. 3 is a waveform diagram illustrating effects of improving a phase deviation of load current in the first preferred embodiment.

FIG. 3 is a graph illustrating load current in the D-A converter of the first preferred embodiment. In FIG. 3, an ideal load current $I_0$ exhibits curve L1', but its actual curve deviates to a plus side relative to reference current $I_{00}$ (curve L2') or deviates to a minus side (curve L3') because of a V-I conversion characteristic of the V-I converting unit 210 (220). In such a case, a leading phase results in the case of deviation to the plus side while a lagging phase results in the case of deviation to the minus side.

However, the D-A converter of the first preferred embodiment switches its analog current output path conducting the D-A converting and the V-I converting depending upon 1 or 0 of the most significant bit of N bit digital data DATA, and therefore, a phase deviation can be corrected at time $t_{00}$ for its switching as shown in FIG. 3. Thus, compared to the prior art D-A converter, the phase deviation caused by the V-I conversion characteristic of the V-I converting unit 210 (220) is highly improved.

Figure 4:
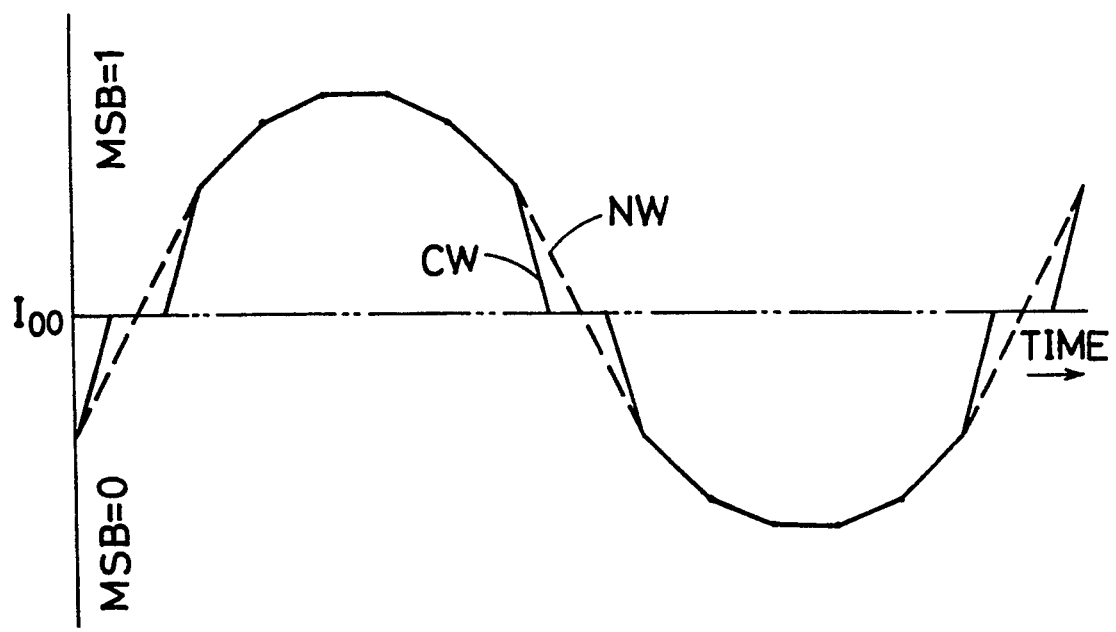
FIG. 4 is a waveform diagram illustrating effects of improving a crossover distortion of the first preferred embodiment.

In the D-A converter of the first preferred embodiment, one of the V-I converting units 210 and 220 operates depending upon the value of the most significant bit of the digital signal DATA. That which will be discussed below is a case where one of the source current $I_{01}$ and the sink current $I_{02}$ is set zero. In either case, one of the transistor 52 of the V-I converting unit 210 and the transistor 54 of the V-I converting unit 220 turns off. A property of the load current $I_0$ at this time assumes a crossover distortion as designated by CW which is often observed in an output waveform of a push-pull output circuit of an amplifier, as shown in FIG. 4.

When the most significant bit of the digital signal DATA shifts from 0 to 1, for example, the transistor 54 of the V-I converting unit 220 turns off, which causes the sink current $I_{02}$ to become zero, and simultaneously the transistor 52 of the V-I converting unit 210 turns on, which causes the source current $I_{01}$ (>0) to flow. However, it takes a slight time to shift the transistor 52 from its OFF-state to its ON-state. This is because it takes time from an accumulation of electric charges sufficient for a transition to the ON-state of the transistor 52 until change to a state where the transistor 52 is saturated. In this way, since it takes time to shift the transistor from its OFF-state to its ON-state, a crossover distortion is caused.

Such a crossover distortion is caused because one of the transistors 52 and 54 is in its OFF-state in their ON/OFF switching time. Then, it is arranged that the data dividing block 7 of the D-A converter of the first preferred embodiment outputs fixed digital data F1 according to which analog voltage $V_2$ output from the D-A converting block 12 satisfies $V_2 > 0$ ($V_B > 0$ in Formula 23) in case of the most significant bit=1, or otherwise it outputs fixed digital data F2 according to which analog voltage $V_1$ output from the D-A converting block 11 satisfies $V_1 < V_{CC}$ ($V_A > 0$ in Formula 9) in case of the most significant bit=0.

In an arrangement as described above, since the transistors 52 and 54 are always in their ON-state, ideal current always flows. Thus, as shown by curve designated by NW in FIG. 4, no crossover distortion arise in the switching of the most significant bit to 1 or 0.

Figure 5:
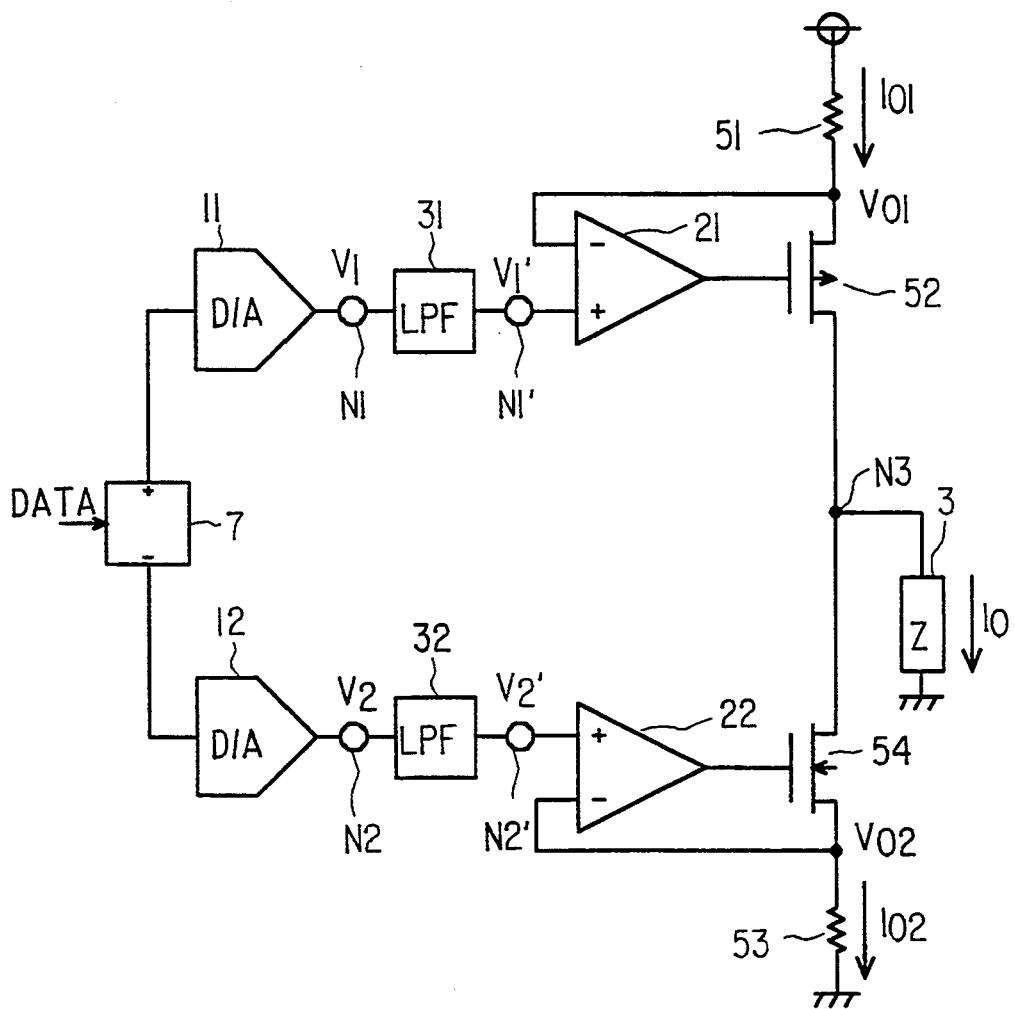
FIG. 5 is a circuit diagram showing a structure of a D-A converter of a second preferred embodiment according to the present invention.

FIG. 5 is a circuit diagram showing a structure of a D-A converter of a second preferred embodiment according to the present invention. As shown in FIG. 5, a low pass filter (LPF) 31 is interposed between a D-A converting block 11 and a positive input of an operational amplifier 21, and a low pass filter 32 is interposed between a D-A converting block 12 and a positive input of an operational amplifier 22. Other corresponding structure is similar to that in the first preferred embodiment, and therefore the description is omitted.

In the above mentioned structure, voltages $V_1'$ and $V_2'$ which are obtained by eliminating high frequency components from output voltages $V_1$ and $V_2$ from the D-A converting blocks 11 and 12, respectively, are applied to the positive inputs of the operational amplifiers 21 and 22, respectively. Specifically, since the voltages $V_1'$ and $V_2'$ which are obtained by eliminating digital components of digital signal DATA from the voltages $V_1$ and $V_2$ can be received on nodes $N_1'$ and $N_2'$, respectively, and there is an effect that the eventually obtained load current $I_0$ exhibits a waveform which is full of continuity.

Figure 6:
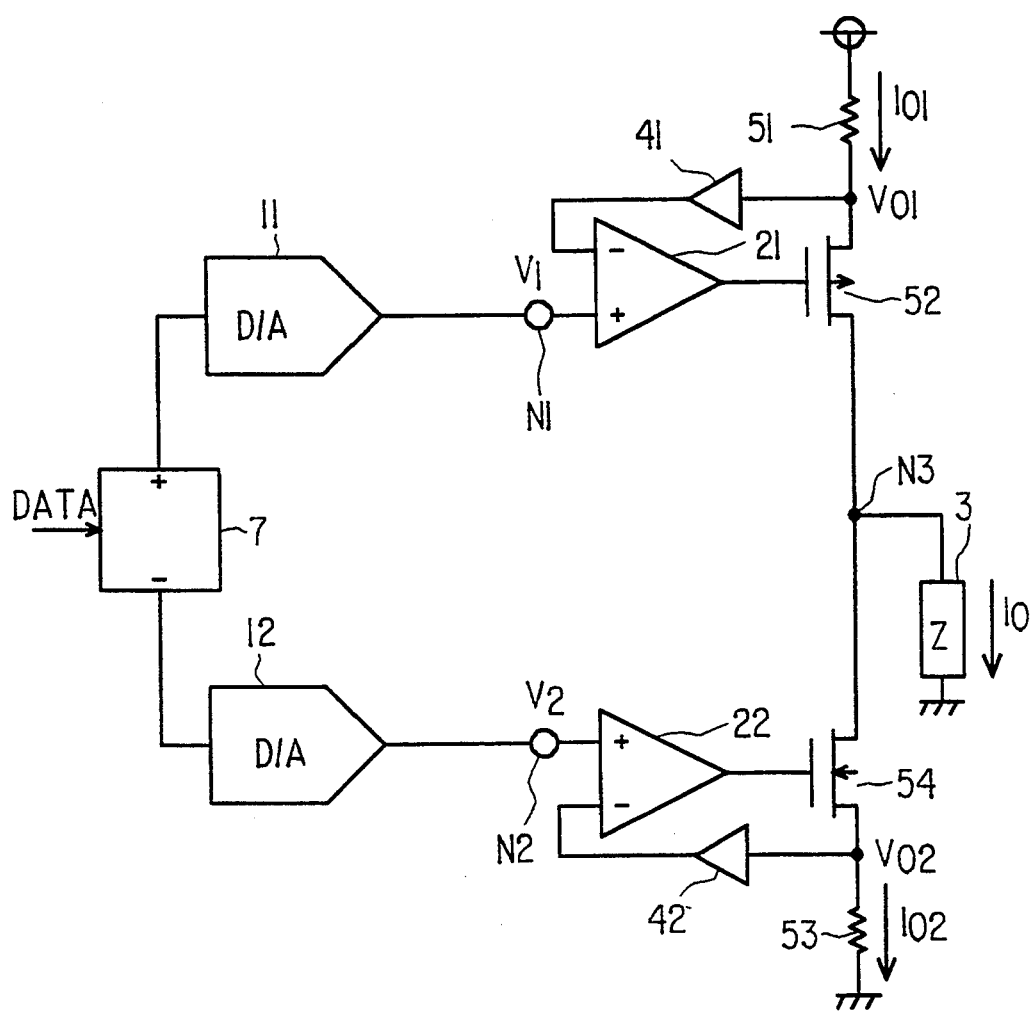
FIG. 6 is a circuit diagram showing a structure of a D-A converter of a third preferred embodiment according to the present invention.
Figure 7:
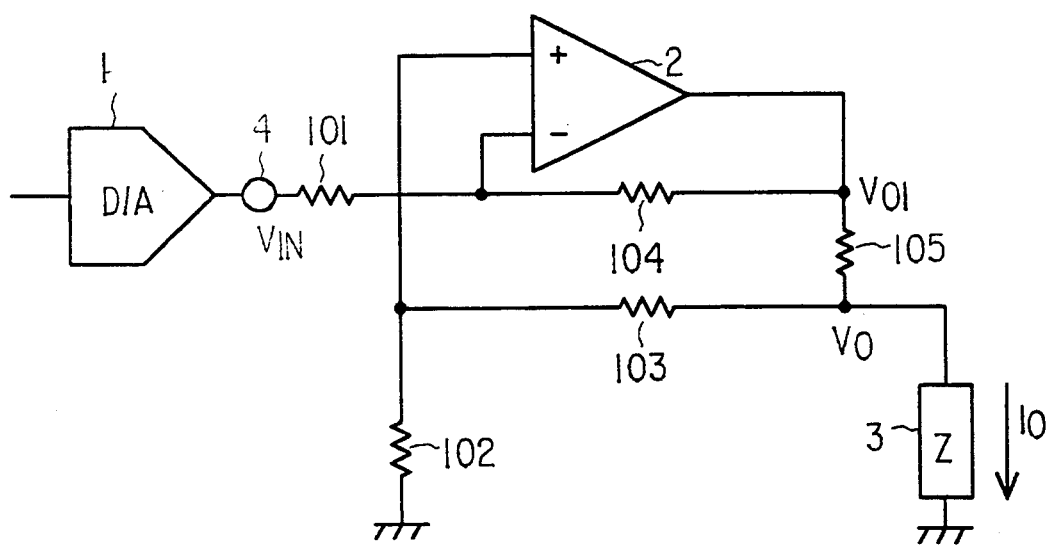
FIG. 7 is a circuit diagram showing a structure of a prior art D-A converter.

FIG. 6 is a circuit diagram showing a structure of a D-A converter of a third preferred embodiment according to the present invention. As shown in FIG. 6, a buffer an amplifier having unity gain 41 is interposed between a negative input of an operational amplifier 21 and a resistance 51, having its input close to the resistance 51, and similarly, a buffer 42 is interposed between a negative input of an operational amplifier 22 and a resistance 53, having its input close to the resistance 53. Other corresponding structure is similar to that in the first preferred embodiment, and therefore, the description is omitted.

In such a structure, the disadvantage can be overcome that part of the load currents $I_{01}$ and $I_{02}$ flows into the negative inputs of the operational amplifiers 21 and 22 (this is caused in the first and second preferred embodiments).

As has been described, according to a D-A converter as defined in a first embodiment there are provided a first analog current output path consisting of first D-A converting means and first voltage to current converting means, and a second analog current output path consisting of second D-A converting means and second voltage to current converting means.

Furthermore, a digital data dividing means is utilized to output partial digital data to one of the analog current output paths depending upon a logic 0 or 1 of the most significant bit of an N-bit digital signal, and therefore, the number of bits required by first and second D-A converters may be a half of the number of bits required in case where only one D-A converter is used. Accordingly, enhancement of a D-A conversion accuracy can be attained.

Moreover, synthetic current is obtained by synthesizing first and second analog currents output from the first and second analog current output paths, and therefore, its range can effectively become larger, compared with a structure where only one analog current output path is provided.

In addition to that, since switching is selectively conducted between the first and second analog current output paths depending upon 0 or 1 of the most significant bit of the digital signal, phase distortion caused in the synthetic current is corrected at a time of the switching of the most significant bit to logic 0 or 1, and therefore, the phase distortion caused in the synthetic current can be inhibited.

According to a D-A converter as defined in one of the embodiments, first and second low pass filters are provided between outputs of first and second D-A converting means and inputs of first and second voltage to current converting means, respectively, and thereby digital components of waveforms of first and second analog voltages are eliminated and then the remaining components are applied to the first and second voltage to current converting means, respectively. Thus, a waveform of the eventually obtained synthetic current can exhibit continuity.

While the invention has been shown and described in detail, the foregoing description is in all aspects illustrative and not restrictive. It is therefore understood that numerous modifications and variations can be devised without departing from the scope of the invention.

I claim:

1. A D-A converter comprising:
   digital data dividing means, having first and second outputs and receiving an N bit digital signal, for outputting from the first output partial digital data which is (N-1) bit digital data obtained by eliminating the most significant bit from said digital signal, and outputting from the second output fixed digital data;
   first D-A converting means connected to said first output of said digital data dividing means for D-A converting said digital data received from said first output to output a first analog voltage;

second D-A converting means connected to said second output of said digital data dividing means for D-A converting said digital data received from said second output to output a second analog voltage;

first voltage to current converting means receiving said first analog voltage for voltage to current converting said first analog voltage to output a first analog current;

second voltage to current converting means receiving said second analog voltage for voltage to current converting said second analog voltage to output a second analog current; and current synthesizing means for synthesizing said first analog current and said second analog current to output synthetic analog current;

wherein said first voltage to current converting means includes:

a first operation amplifier for receiving said first analog voltage on its positive input, a first resistance having its first terminal connected to a negative input of said first operational amplifier and its second terminal connected to first supply voltage, and a first transistor having its first electrode connected to said first terminal of said first resistance and its control electrode connected to the output of said first operational amplifier; and wherein said second voltage to current converting means includes:

a second operational amplifier for receiving said second analog voltage on its positive input, a second resistance having its first terminal connected to a negative input of said second operational amplifier and its second terminal connected to a second supply voltage, and a second transistor having its first electrode connected to said first terminal of said second resistance and its control electrode connected to the output of said second operational amplifier; and the current synthesizing means is wiring for connecting the second electrode of said first transistor and the second electrode of said second transistor.

2. A D-A converter according to claim 1, further comprising:

a first buffer having its input connected to said first terminal of said first resistance and its output connected to the negative input of said first operational amplifier, and a second buffer having its input connected to said first terminal of said second resistance and its output connected to the negative input of said second operational amplifier.

3. A D-A converter according to claim 1, wherein:

said first supply voltage defines High level while said second supply voltage defines Low level; and said first transistor is a P channel transistor while said second transistor is an N channel transistor.

4. A D-A converter according to claim 3, wherein:

said digital data dividing means outputs said partial digital data to said first D-A converting means and first fixed digital data to said second D-A converting means when the most significant bit of said digital data is 1; or otherwise it outputs said partial digital data to said second D-A converting means and second fixed digital data to said first D-A converting means when the most significant bit of said digital data is 0.

5. A D-A converter according to claim 4, wherein:

first analog voltage which said first D-A converting means develops by D-A converting said second fixed digital data is of a value sufficient to always keep said second transistor in its ON-state; and second analog voltage which said second D-A converting means develops by D-A converting said first fixed digital data is of a value sufficient to always keep said first transistor in its ON-state.

6. A D-A converter according to claim 5, wherein:

said synthetic current is a current for driving a load having a specified impedance.

7. A D-A converter according to claim 1, wherein:

said D-A converter further comprises:

a first low pass filter interposed between output of said first D-A converting means and input of said first voltage to current converting means, and a second low pass filter interposed between output of said second D-A converting means and input of said second voltage to current converting means.

* * * * *